US011056379B2

(12) United States Patent
Barker et al.

(10) Patent No.: US 11,056,379 B2
(45) Date of Patent: Jul. 6, 2021

(54) CLAMP ASSEMBLY

(71) Applicant: SPTS TECHNOLOGIES LIMITED, Newport (GB)

(72) Inventors: Anthony Barker, Cardiff (GB); Huma Ashraf, Newport (GB); Brian Kiernan, Cardiff (GB)

(*) Notice: Subject to any disclaimer, the term of this patent is extended or adjusted under 35 U.S.C. 154(b) by 14 days.

(21) Appl. No.: 14/925,715

(22) Filed: Oct. 28, 2015

(65) Prior Publication Data

US 2016/0126129 A1    May 5, 2016

(30) Foreign Application Priority Data

Oct. 29, 2014  (GB) ..................................... 1419210

(51) Int. Cl.
*H01L 21/687*  (2006.01)
*H01L 21/67*  (2006.01)
*H01L 21/3065*  (2006.01)
*H01J 37/32*  (2006.01)

(52) U.S. Cl.
CPC .. *H01L 21/68728* (2013.01); *H01J 37/32082* (2013.01); *H01L 21/3065* (2013.01); *H01L 21/67069* (2013.01); *H01L 21/68721* (2013.01)

(58) Field of Classification Search
CPC .................................................. H01L 21/68721
USPC .................. 118/728–732; 156/345.51–345.55
See application file for complete search history.

(56) References Cited

U.S. PATENT DOCUMENTS

| | | | |
|---|---|---|---|
| 5,405,491 A * | 4/1995 | Shahvandi | H01J 37/32559 156/345.51 |
| 5,421,401 A | 6/1995 | Sherstinsky et al. | |
| 5,437,757 A | 8/1995 | Rice et al. | |
| 5,534,110 A | 7/1996 | Lenz et al. | |
| 5,632,873 A | 5/1997 | Stevens et al. | |
| 5,843,520 A * | 12/1998 | Liu | C23C 14/50 427/124 |
| 5,922,133 A * | 7/1999 | Tepman | C23C 14/50 118/503 |
| 5,997,651 A * | 12/1999 | Matsuse | C23C 16/455 118/715 |
| 6,106,664 A | 8/2000 | Lee et al. | |
| 6,123,804 A * | 9/2000 | Babassi | H01L 21/68721 118/715 |
| 6,162,336 A * | 12/2000 | Lee | C23C 14/50 118/500 |
| 6,231,038 B1 | 5/2001 | Keyser et al. | |

(Continued)

FOREIGN PATENT DOCUMENTS

CN   103403852 A   11/2013
EP   0392516 A2   4/1990
EP   0665575 A1   1/1995

*Primary Examiner* — Karla A Moore
*Assistant Examiner* — Tiffany Z Nuckols
(74) *Attorney, Agent, or Firm* — Hodgson Russ LLP

(57) ABSTRACT

A clamp assembly is for clamping an outer peripheral portion of a substrate to a support in a plasma processing chamber. An RF bias power is applied to the support during the plasma processing of the substrate. The clamp assembly includes an outer clamp member, and an inner clamp member which is received by the outer clamp member, the inner clamp member defining an aperture which exposes the substrate to the plasma processing. The outer clamp member has an inner portion terminating in an inner edge, wherein the inner portion is spaced apart from the inner clamp member.

20 Claims, 3 Drawing Sheets

(56) References Cited

U.S. PATENT DOCUMENTS

| | | | | |
|---|---|---|---|---|
| 6,380,094 B1* | 4/2002 | Seidel | ............ | H01L 21/321 |
| | | | | 257/E21.3 |
| 6,511,543 B1* | 1/2003 | Stauss | ............ | H01L 21/68721 |
| | | | | 118/500 |
| 6,797,068 B1* | 9/2004 | Yamasaki | ............ | C23C 16/45521 |
| | | | | 118/725 |
| 2012/0003388 A1* | 1/2012 | Tzu | ............ | C23C 16/4412 |
| | | | | 427/250 |
| 2014/0017900 A1* | 1/2014 | Doba | ............ | H01J 37/32091 |
| | | | | 438/710 |
| 2015/0170884 A1* | 6/2015 | Ouye | ............ | H01J 37/32642 |
| | | | | 438/462 |

* cited by examiner

CLAMP ASSEMBLY

BACKGROUND

This invention relates to a clamp assembly for clamping a wafer to a support in a plasma processing chamber, and to associated plasma processing apparatus, methods, clamp members and kits of parts.

In the field of plasma etching, wafers are typically held in place by either an electrostatic chuck (ESC) or by a mechanical clamp in order to ensure accurate registration of the wafer within the system, and to enable cooling of the wafer. An ESC uses electrostatic force to retain a wafer in position. A mechanical clamp relies on mechanical means, such as fingers or annular structures to press down on the wafer to hold it in place. It is quite common for a gas flow to be directed between the wafer and the top of a wafer supporting platen to enhance heat transfer from the wafer to the cooled platen assembly. This is a way in which the temperature of the wafer can be controlled.

The processing of thin wafers mounted on carriers presents specific problems, especially for the plasma etching of through wafer vias. Carrier wafers are generally made from insulating material, and in these instances electrostatic clamping alone is ineffective. The carriers are often expensive and are reused. In addition, edge protection of the thinned wafer may be required. It is known to use a "finger" type mechanical clamp having digitate members, and an example is described in U.S. Pat. No. 610,664. However, the digitate members increase the wafer edge exclusion caused by the clamp. Additionally, clamps of this type allow plasma attack of the thinned wafer and carrier which reduces carrier lifetime and increase the risk of problems associated with particulate material. It is known to provide single piece annular mechanical clamps. An example of such a prior art clamp is depicted in FIG. 1, which shows a thin wafer and carrier 10 positioned on an ESC 12. The wafer is held in place by the one piece annular clamp 14. Also shown is a liner 16 which is positioned to eliminate unwanted dark space plasma as is known in the art. The annular clamp 14 provides an enhanced clamping force which augments the clamping provided by the ESC 12. It is also possible to dispense with the use of an ESC, and instead rely entirely on the clamp to provide a clamping action on the wafer. The clamp 14 protects the edge of the thin wafer and carrier 10, and the carriers can be reused. However, in order to minimise wafer edge exclusion, the annular clamp must be thin in the area of contact with the wafer. A problem encountered with annular clamps of this type is that the erosion rate of the clamp is high. The result of using a thin clamp which is eroded at a high rate is that the useful lifetime of the clamp is low, and the clamp must be replaced often. Clearly this is undesirable from a commercial point of view and it results in a high COO (cost of ownership) and also a low MWBC (mean wafers between cleans) and MTBC (mean time between cleans). It is known to provide a two piece clamp assembly in which an inner clamp piece is sacrificial. Examples of two piece clamp assemblies are disclosed in U.S. Pat. Nos. 5,534,110 and 6,231,038. In U.S. Pat. No. 6,231,038, one of the pieces is sacrificial, which has the advantage that only the sacrificial piece needs to be replaced, which reduces the cost of the replacement part. However, this approach does not reduce the other costs associated with interrupting the manufacturing process. Also, the MWBC and MTBC are not improved.

BACKGROUND

The present invention, in at least some of its embodiments, addresses the above described problems. It should be noted that the problems described above are not exclusively associated with thinned wafers on carriers. Instead, these problems relate to the processing of substrates such as wafers per se, and the invention relates to substrates such as wafers per se.

According to a first aspect of the invention there is provided a clamp assembly for clamping a substrate to an outer peripheral portion of a support in a plasma processing chamber of the type in which an RF Bias power is applied to the support during the plasma processing of the substrate, the clamp assembly comprising:

an outer clamp member; and an inner clamp member which is received by the outer clamp member, the inner clamp member defining an aperture which exposes the substrate to the plasma processing;

in which the outer clamp member has an inner portion terminating in an inner edge, wherein the inner portion is spaced apart from the inner clamp member.

The provision of a gap between the outer clamp member and the inner clamp member can reduce the erosion rate, and thereby increase the lifetime of the inner clamp member. The inner clamp member may be used as a sacrificial element of the clamp assembly.

An RF bias power is applied to the support during the plasma processing of the substrate. The present inventors have realised that by spacing apart the inner portion of the outer clamp member from the inner clamp member, it is possible to reduce RF coupling between the inner clamp member and the support. This in turn reduces the erosion rate of the inner clamp member.

The skilled reader will appreciate that the terms "inner", "outer", "inwardly" and "outwardly" as used herein in connection with the invention relate to the proximity of a feature to the aperture defined by the inner clamp member.

The inner portion of the outer clamp member may be spaced apart from the inner clamp member by a gap of less than 250 microns. The gap may be less than 100 microns, and preferably less than 80 microns.

At least one of the inner clamp member and the outer clamp member may have a clamping surface for clamping the outer peripheral portion of the substrate.

The outer clamp member may comprise a clamping surface for clamping the outer peripheral portion of the substrate. The clamping surface of the outer clamp member may contribute, in use, the majority of the clamping force on the wafer provided by the clamp assembly. Typically, the clamping surface of the outer clamp comprises part of a lower surface of the outer clamp.

The inner clamp member may comprise a clamping surface for clamping the outer peripheral portion of the substrate. The lower surface of the inner clamp member may comprise a flange. The flange may comprise the clamping surface of the inner clamp member. The flange may further comprise an inner surface which extends inwardly of the clamping surface of the inner clamp member. The inner surface may be raised with respect to the clamping surface so that, in use, the inner surface does not clamp the outer peripheral portion of the substrate. The inner surface may be raised with respect to the clamping surface by less than 100 microns. The raised inner surface may further reduce RF coupling and reduce the erosion rate.

The inner surface may extend inwardly of the lower clamping surface by less than 0.75 mm, preferably less than 0.5 mm.

The inner clamp member may have an inner edge. The inner edge may be inwardly disposed of the inner edge of the outer clamp member by no more than 1 mm.

The inner clamp member may have an outer portion which is spaced apart from the outer clamp member. The outer portion of the inner clamp member may be spaced apart from the outer clamp member by a gap of less than 0.75 mm, preferably less than 0.5 mm.

The outer clamp member may comprise a first upper surface and a second upper surface disposed inwardly of the first upper surface. The outer portion of the inner clamp member may be in contact with the second upper surface. The outer portion of the inner clamp member may be spaced apart from the first upper surface. The first and second upper surfaces of the outer clamp member may be separated by a step portion. The outer portion of the inner clamp member may be spaced apart from the step portion.

The outer clamp member may comprise a body portion which is disposed outwardly of the inner portion. The body portion may be thicker that the inner portion. The body portion may extend below the level of the inner portion. The term "level" is understood to relate to a horizontal plane which includes the lowermost point or surface of the inner portion when the clamp assembly is in its in use configuration.

The inner and outer clamp members may be annular. In principle, either or both of the inner and outer clamp members may comprise a plurality of sub-units. For example, a split-ring arrangement might be contemplated.

The inner and outer clamp members may be formed from a dielectric material. The dielectric material may be alumina. Other insulating materials such as other ceramic materials may be used. The dielectric material may be quartz.

The outer clamp member may comprise one or more retaining features for retaining the inner clamp member in a desired alignment or registration with the outer clamp member. The retaining features may be inclined surfaces, raised features, indented features, detents, cut-outs, or any other suitable feature for maintaining a mutual alignment between the inner and outer clamp members. Cooperating features may be provided on the inner clamp member.

According to a second aspect of the invention there is provided an inner clamp member for use in a clamp assembly of the first aspect of the invention.

According to a third aspect of the invention there is provided an outer clamp member for use in a clamp assembly of the first aspect of the invention.

According to a fourth aspect of the invention there is provided a kit of parts for a clamp assembly according to the first aspect of the invention, the kit of parts comprising an inner clamp member and an outer clamp member.

According to a fifth aspect of the invention there is provided a plasma processing apparatus including a clamp assembly of the first aspect of the invention. The plasma processing apparatus may be in the form of a plasma etching apparatus.

The plasma processing apparatus comprises an RF driven support for the substrate. The support may comprise an electrostatic chuck.

The substrate may comprise semiconductor material.

The substrate may be a planar substrate.

The substrate may be a wafer. The substrate may comprise a wafer on a carrier wafer. The substrate may comprise a thinned wafer on a carrier wafer. An example of a thinned wafer is a thinned SiC wafer A thinned wafer maybe less than 500 microns thick, preferably less than 300 microns thick.

According to a sixth aspect of the invention there is provided a method of plasma processing a substrate in a plasma processing chamber comprising the steps of:

clamping the substrate to a support using a clamp assembly of the first aspect of the invention; and plasma processing of the substrate, in which an RF bias power is applied to the support during the plasma processing of the substrate.

Whilst the invention has been described above, it extends to any inventive combination of the features set out above, or in the following description, drawings or claims. For example, any feature described in relation to one aspect of the invention is considered to be disclosed also in relation to any other aspect of the invention.

BRIEF DESCRIPTION OF THE DRAWINGS

Embodiments of clamp assemblies in accordance with the invention will now be described with reference to the accompanying figures, in which.

DETAILED DESCRIPTION OF EMBODIMENTS

Figure 2:
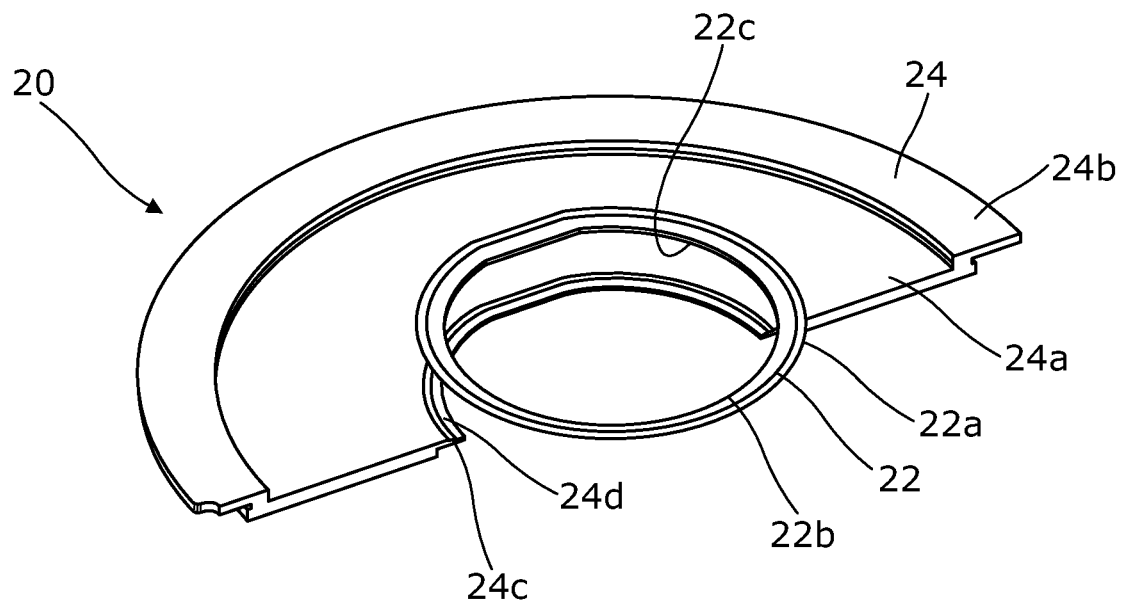
FIG. 2 shows an exploded perspective view of a clamp assembly, with a cut away view of the inner clamp ring.
Figure 3A:
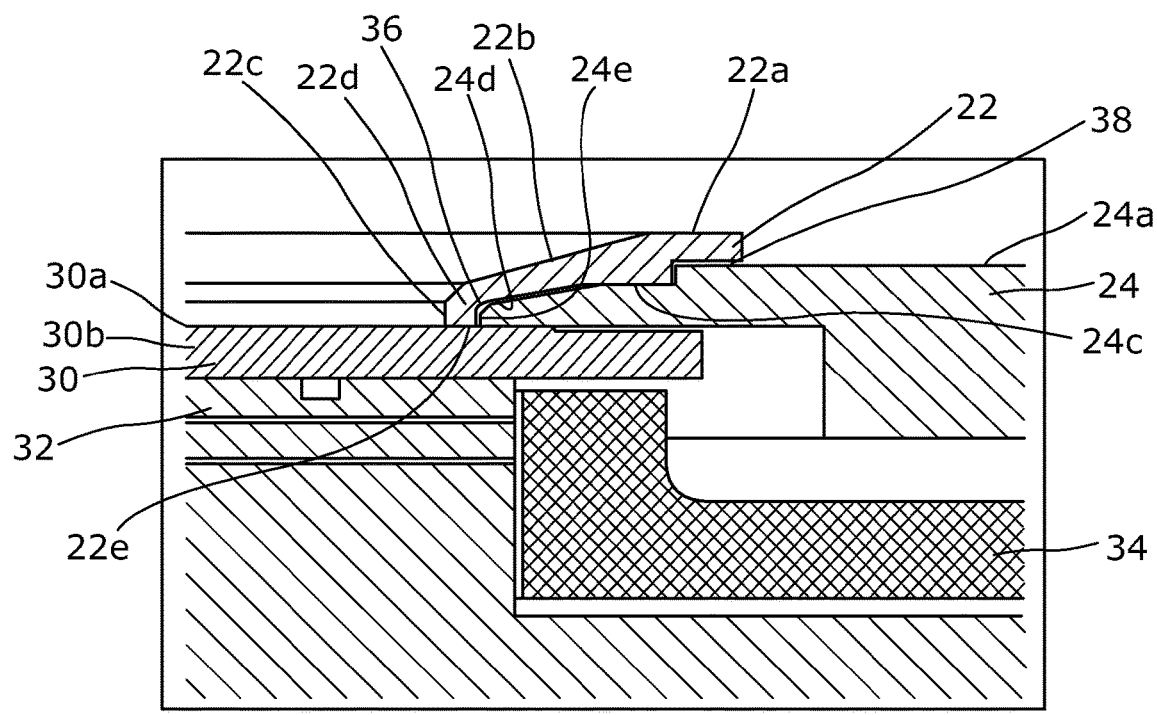
FIG. 3a shows a partial cross sectional view of a wafer clamped by the clamp assembly of FIG. 2.
Figure 3B:
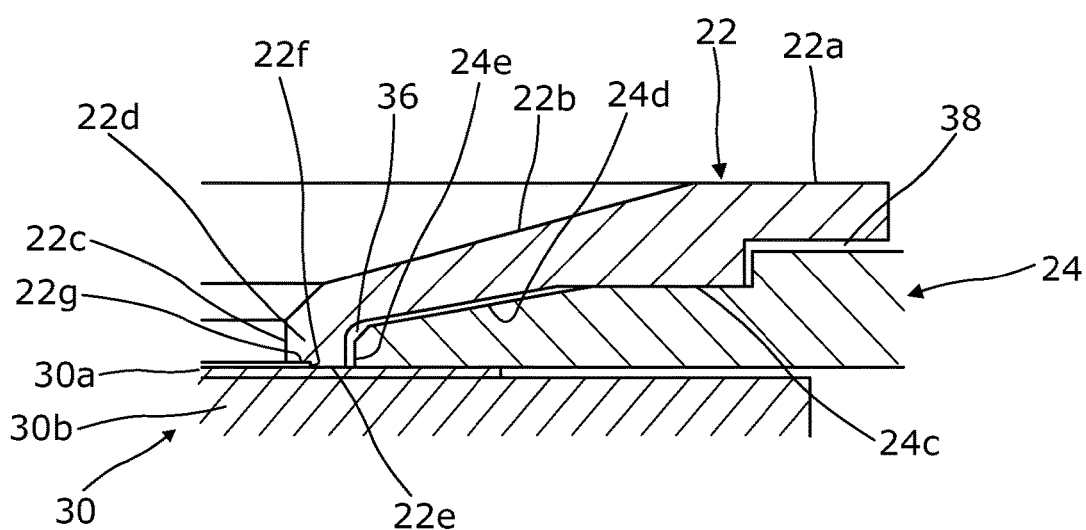
FIG. 3b shows an enlarged partial cross sectional view in the region of the clamp assembly where an inner portion of the outer clamp ring is spaced apart from the inner clamp ring.

FIG. 2 shows a clamp assembly, depicted generally at 20, of the invention. The clamp assembly 20 comprises an outer ring 24 and inner ring 22. The outer ring 24 comprises a first, main upper surface 24a which is surrounded by a rim 24b which is raised with respect to the first upper surface 24a. Inward of the first upper surface 24a there is a downward step leading to a second upper surface 24c which is disposed below the level of the first upper surface 24a. The outer ring 24 further comprises an annular sloping surface 24d which is inclined inwardly and downwardly of the second upper surface 24c. The sloping surface 24d leads to an inner edge 24e which is best seen in FIG. 3. The sloping surface 24d, second upper surface 24c and the innermost region of the first upper surface 24a define a receptacle area in which the inner ring 22 can be received. The inner ring 22 comprises an upper surface 22a, a sloping surface 22b which slopes inwardly and downwardly of the upper surface 22a, and an inner edge 22c.

FIGS. 3 (a) and (b) shows the clamp assembly 20 being used to clamp a wafer 30 in a plasma etching apparatus. In the embodiment shown in FIG. 3, the wafer 30 is of the wafer on carrier type, comprising a thin wafer 30a on a much thicker carrier 30b. The wafer 30 is positioned on an electrostatic chuck 32. A liner 34 is provided beneath and beyond the periphery of the wafer 30 in order to eliminate dark space plasma, as is well known in the art.

The clamp assembly 20 is of the design shown in FIG. 2 and therefore identical reference numerals are used to denote the features of the clamp assembly 20. The inner edge 24e of the outer ring 24 can be seen more clearly in FIG. 3(b). The outer ring 24 provides most of or even all of the clamping force for the wafer associated with the clamps. The outer ring 24 should be large enough to reliably clamp the outer peripheral region of the wafer with a suitable amount of overlap. An overlap of around 2 mm is usually considered satisfactory. The inner clamp 22 can be provided as a sacrificial part. The inner ring 22 is desirably thin, and should not protrude greatly from the inner edge 24e of the outer ring 24 in order to minimise wafer edge exclusion. In general, the inner ring 22 is designed so as to not protrude more than 1 mm from the inner edge 24e. The inner ring 22 and outer ring 24 are manufactured so that there is a spacing 36 between the inner and outer rings 22, 24. The spacing 36 is an annular spacing between the innermost portion of the inner ring 22 and the sloping surface 24d/inner edge 24e of the outer ring 24. This corresponds to a region of the wafer which is RF driven. The spacing 36 significantly reduces RF coupling between the inner ring 22 and the electrostatic chuck 32, and this significantly reduces the erosion rate of the inner ring 22 in use. It has been found that the spacing 36 does not need to be very large in order to significantly reduce RF coupling. The spacing 36 is generally less than 500 microns, and typically is less than 100 microns. The inner ring 22 comprises an inner annular flange 22d which carries the inner edge 22c. The inner flange 22d has a clamping surface 22e which contacts the surface of the wafer 30. In practice, the clamping force applied by the clamping surface 22e may be minimal. The inner flange 22d further comprises an inner step portion 22f including an inner surface 22g which is raised with respect to the clamping surface 22e. The inner surface 22g is raised so that when the wafer 30 is clamped, there is a suitable gap to further reduce RF coupling and thereby further reduce the erosion rate of the inner ring 22. A representative but non-limiting gap is 70 microns. The radial extent of the inner surface 22g is typically around 400 microns. The inner and outer rings 22, 24 are also manufactured so that there is a gap 38 between an outer region of the inner ring 22 and the first upper surface 24a of the outer ring 24. The gap 38 is typically less than 500 microns. The gap 38 reduces the level of particles which might otherwise be present due to relative movement of the inner and outer rings.

Figure 1:
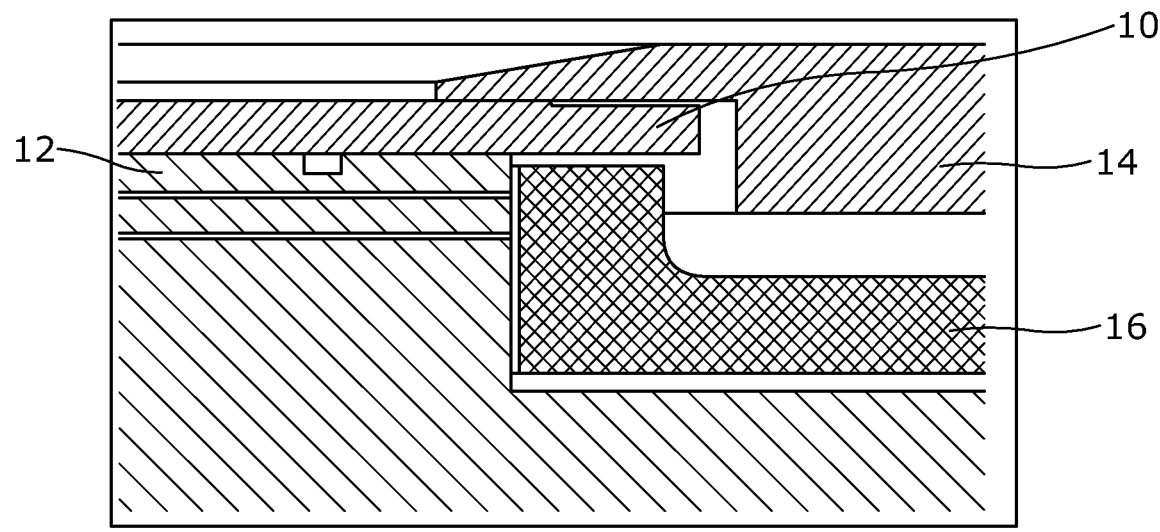
FIG. 1 is a partial cross sectional view of a wafer clamped by a single piece prior art clamp ring.
Figure 4:
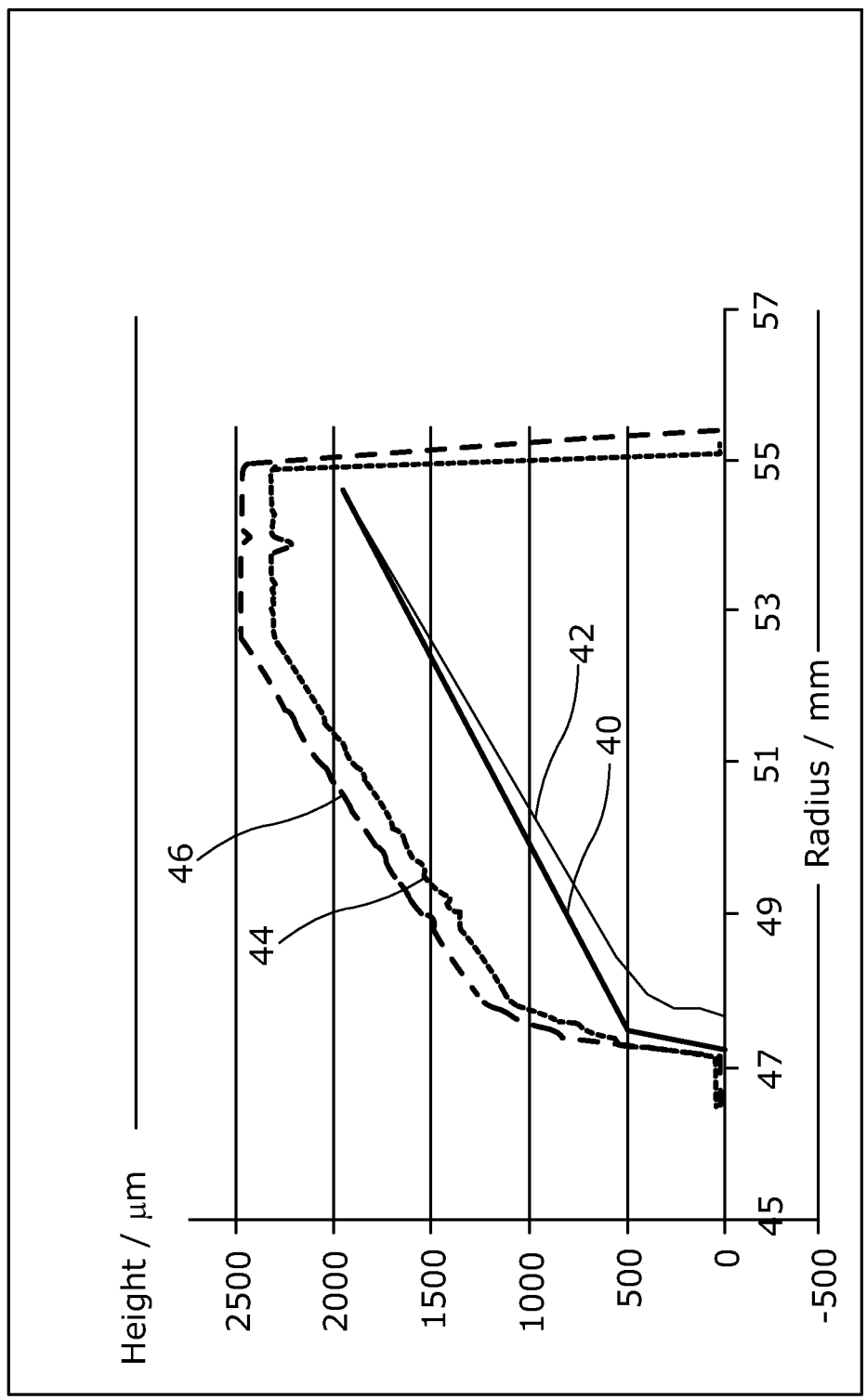
FIG. 4 shows optical measurements of the dimensions of clamp rings before and after etching.

Experiments were performed using plasma etching to process silicon carbide wafers. Etching was performed using a one piece clamping ring of the type shown in FIG. 1, and with a two piece clamp assembly of the invention as shown in FIGS. 2 and 3. The one piece clamping ring and the two piece clamp assembly were both formed from alumina. Etching was performed for 40 RF hours using the one piece clamping ring, and for 30 RF hours using the two piece clamp assembly. Optical measurements of the dimensions of the clamp ring and clamping assembly were made before and after the etching process. The results of the optical measurements can be seen in FIG. 4. The profile 40 corresponds to the single piece clamp ring before etching; profile 42 corresponds to the single piece clamp ring after 40 RF hours etching; profile 44 corresponds to the two part clamp assembly before etching; and profile 46 corresponds to the two part clamp assembly after 30 RF hours etching. FIG. 4 shows that the single piece clamp ring erodes rapidly at a rate of around 1 mm diameter per 25 full wafers/40 RF hours. After around 25 wafers have been etched, the single piece clamp ring must be replaced. It can be seen that the lateral erosion rate of the sacrificial, inner clamp ring of the clamp assembly has been reduced to nearly zero. No change in the inner diameter of the two piece clamp assembly was measured after 30 RF hours of etching. It is noted in passing that FIG. 4 does indicate an increase in height and outer diameter of the two piece clamp assembly after etching. This is a genuine result, and is believed to be due to a build up of polymer deposition on the clamp assembly. FIG. 4 indicates that the present invention can substantially reduce erosion rate and thereby increase the lifetime of the sacrificial inner clamp ring. Due to the physical nature of the wafer processing, there is a substantial build up of involatile products in the chamber. Opening the chamber to change a part such as the clamp would trigger a chamber clean. Therefore, increasing the life time of the sacrificial part of a clamp assembly increases the MTBC.

What is claimed is:

1. A clamp assembly for clamping an outer peripheral portion of a substrate to a support in a plasma processing chamber of the type in which an RF bias power is applied to the support during the plasma processing of the substrate, the clamp assembly comprising:
    an outer clamp member constituting a radially outermost part of the clamp assembly, the outer clamp member having a radially inner portion that has an outer clamping surface, constituting the lower part of the clamp assembly disposed on the substrate, for clamping the outer peripheral portion of the substrate to the support; and
    an inner clamp member which is received by the outer clamp member at a receptacle area of the clamp assembly, the inner clamp member having an innermost portion that projects radially inwardly beyond the outer clamp member and constitutes a radially innermost part of the clamp assembly, and the inner clamp member defining an aperture which exposes the substrate to the plasma processing, and
    in which the inner clamp member has a surface that butts against the outer clamp member at said receptacle area of the clamp assembly,
    the radially inner portion of the outer clamp member has an inner edge at which the outer clamp member terminates in a radially inward direction of the outer clamp member, wherein the outer clamping surface of the outer clamp member begins at the inner edge and extends in a radially outward direction,
    the inner clamp member overhangs the radially inner portion of the outer clamp member such that the radially inner portion of the outer clamp member is covered by while spaced apart a finite non-zero distance from the innermost portion of the inner clamp member that projects radially inwardly beyond the outer clamp member and constitutes the radially innermost part of the clamp assembly, and
    the inner clamp member comprises an inner clamping surface, constituting a lower part of the clamp assembly disposed on the substrate, for clamping the outer peripheral portion of the substrate to the support, wherein the inner clamping surface of the inner clamp member is planar with the outer clamping surface of the outer clamp member.

2. A clamp assembly according to claim 1 in which the finite non-zero distance is less than 250 microns.

3. A clamp assembly according to claim 2 in which the finite non-zero distance is less than 100 microns.

4. A clamp assembly according to claim 1 in which the inner clamp member comprises a flange on the inner clamp member, the flange comprising an inner surface which extends radially inwardly of the inner clamping surface and which is raised with respect to the inner clamping surface so that, in use, the inner surface does not clamp the outer peripheral portion of the substrate.

5. A clamp assembly according to claim 4 in which the inner surface is raised with respect to the inner clamping surface by less than 100 microns.

6. A clamp assembly according to claim 4 in which the inner surface extends by about 400 microns in a radial direction of the inner clamp member.

7. A clamp assembly according to claim 1 in which the inner clamp member has an inner edge which is inwardly disposed of the inner edge of the outer clamp member by no more than 1 mm.

8. A clamp assembly according to claim 1 in which the inner clamp member has a radially outer portion which is vertically spaced apart from an upper surface of the outer clamp member such that a gap exists between the radially outer portion of the inner clamp member and the upper surface of the outer clamp member.

9. A clamp assembly according to claim 8 in which the gap is less than 0.75 mm.

10. A clamp assembly according to claim 8 in which the upper surface of the outer clamp member is a first upper surface, the outer clamp member has a second upper surface disposed radially inwardly of the first upper surface, and the radially outer portion of the inner clamp member is in contact with the second upper surface and is spaced apart from the first upper surface, the radially outer portion of the inner clamp member and the second surface of the outer clamp member constituting the receptacle area of the clamp assembly.

11. A clamp assembly according to claim 8 in which the gap is a finite distance of less than 0.5 mm.

12. A clamp assembly according to claim 1 in which the inner and outer clamp members are annular.

13. A clamp assembly according to claim 1 in which the inner and outer clamp members are formed from a dielectric material.

14. A clamp assembly according to claim 13 in which the dielectric material is alumina.

15. A clamp assembly according to claim 2 in which the non-zero finite distance is less than 80 microns.

16. A clamp assembly according to claim 1 in which the upper surface of the outer clamp member is a first upper surface, the outer clamp member has a second upper surface disposed radially inwardly of the first upper surface, and in which the outer clamp member defines a sloping surface between the second upper surface and the inner edge.

17. The clamp assembly according to claim 16, in which the radially outer portion of the inner clamp member is in contact with the second upper surface, and wherein the inner clamp member defines a sloping portion between the radially outer portion and the innermost portion of the inner clamp member.

18. The clamp assembly according to claim 1, in which the inner clamp member defines a sloping surface adjacent a part of the inner clamp member that defines the aperture.

19. A plasma processing apparatus comprising:
a plasma processing chamber;
a substrate support disposed in the plasma processing chamber and dedicated to support a substrate to be plasma processed by the apparatus;
an RF bias power source operatively connected to the substrate support so as to apply RF bias power to the support during plasma processing of the substrate; and
a clamp assembly that clamps an outer peripheral portion of the substrate to the support, the clamp assembly including an outer clamp member constituting an outermost part of the clamp assembly and having a radially inner portion that has an outer clamping surface, constituting the lower part of the clamp assembly disposed on the substrate, for clamping the outer peripheral portion of the substrate to the support, and an inner clamp member which is received by the outer clamp member at a receptacle area of the clamp assembly, the inner clamp member having an innermost portion that projects radially inwardly beyond the outer clamp member and constitutes a radially innermost part of the clamp assembly, and the inner clamp member defining an aperture which exposes the substrate to the plasma processing, and
in which the inner clamp member has a surface that butts against the outer clamp member at said receptacle area of the clamp assembly,
the radially inner portion of the outer clamp member has an inner edge at which the outer clamp member terminates in a radially inward direction of the outer clamp member, wherein the outer clamping surface of the outer clamp member begins at the inner edge and extends in a radially outward direction,
the inner clamp member overhangs the radially inner portion of the outer clamp member such that the radially inner portion of the outer clamp member is covered by while spaced apart a finite non-zero distance from the innermost portion of the inner clamp member that projects radially inwardly beyond the outer clamp member and constitutes the radially innermost part of the clamp assembly, and
the inner clamp member comprises an inner clamping surface, constituting a lower part of the clamp assembly disposed on the substrate, for clamping the outer peripheral portion of the substrate to the substrate support, wherein the inner clamping surface of the inner clamp member is planar with the outer clamping surface of the outer clamp member.

20. A plasma processing apparatus according to claim 19 in the form of a plasma etching apparatus.

* * * * *